(12) United States Patent
Luo et al.

(10) Patent No.: US 11,871,555 B2
(45) Date of Patent: Jan. 9, 2024

(54) SEMICONDUCTOR STRUCTURE AND METHOD FOR FORMING SEMICONDUCTOR STRUCTURE

(71) Applicant: CHANGXIN MEMORY TECHNOLOGIES, INC., Hefei (CN)

(72) Inventors: Qu Luo, Hefei (CN); WenHao Hsieh, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 252 days.

(21) Appl. No.: 17/386,485

(22) Filed: Jul. 27, 2021

(65) Prior Publication Data

US 2021/0358920 A1    Nov. 18, 2021

Related U.S. Application Data

(63) Continuation of application No. PCT/CN2021/090098, filed on Apr. 27, 2021.

(30) Foreign Application Priority Data

May 18, 2020   (CN) .......................... 202010419476.4

(51) Int. Cl.
*H10B 12/00*      (2023.01)
(52) U.S. Cl.
CPC ........... *H10B 12/053* (2023.02); *H10B 12/34* (2023.02)
(58) Field of Classification Search
None
See application file for complete search history.

(56) References Cited

U.S. PATENT DOCUMENTS 6,844,591 B1   1/2005  Tran
7,915,121 B1   3/2011  Kim
(Continued)

FOREIGN PATENT DOCUMENTS

CN    101996950 A    3/2011
CN    102097375 A    6/2011
(Continued)

OTHER PUBLICATIONS

Supplementary European Search Report in the European application No. 21798541.5, dated Aug. 8, 2022, 8 pgs.
(Continued)

*Primary Examiner* — Hsien Ming Lee
(74) *Attorney, Agent, or Firm* — Cooper Legal Group, LLC

(57) ABSTRACT

A semiconductor structure and method for forming the semiconductor structure are provided. The method includes: providing a semiconductor substrate, which has a plurality of independent active areas that are isolated from each other by shallow trench isolation areas; forming trenches by etching the active areas and the shallow trench isolation areas, the trenches include first trenches and second trenches, the first trenches are located in the active areas, the second trenches are located in the shallow trench isolation areas, and the first trenches have a width greater than a width of the second trenches; forming word lines in the trenches, the word lines include first word lines and second word lines, each first word line is located in the respective first trench, each second word line is located in the respective second trench, and the first word lines have a width greater than a width of the second word lines.

16 Claims, 18 Drawing Sheets

(56) References Cited

U.S. PATENT DOCUMENTS

| | | |
|---|---|---|
| 8,048,737 B2 | 11/2011 | Kim |
| 8,624,350 B2 | 1/2014 | Kim |
| 9,589,964 B1 | 3/2017 | Lim |
| 9,859,284 B2 | 1/2018 | Wang |
| 9,859,285 B2 | 1/2018 | Wang |
| 9,953,982 B1 | 4/2018 | Chen |
| 10,847,518 B2 | 11/2020 | Wang |
| 2005/0056887 A1 | 3/2005 | Tran |
| 2005/0106820 A1 | 5/2005 | Tran |
| 2006/0240634 A1 | 10/2006 | Tran |
| 2007/0176232 A1 | 8/2007 | Tran |
| 2011/0027988 A1* | 2/2011 | Hwang ............... H10B 12/053 257/E21.159 |
| 2011/0037111 A1 | 2/2011 | Kim |
| 2012/0074518 A1 | 3/2012 | Kim |
| 2015/0056781 A1* | 2/2015 | Akarvardar ....... H01L 21/76264 438/413 |
| 2015/0294975 A1* | 10/2015 | Nakata ............. H01L 21/02247 257/334 |
| 2017/0213834 A1 | 7/2017 | Wang |
| 2017/0213837 A1 | 7/2017 | Wang |
| 2018/0083011 A1 | 3/2018 | Wang |
| 2018/0342613 A1 | 11/2018 | Chang et al. |
| 2019/0267374 A1* | 8/2019 | Hung .............. H01L 21/823437 |
| 2019/0341487 A1 | 11/2019 | Chang et al. |
| 2020/0161305 A1* | 5/2020 | Nam .................. H10B 12/0335 |
| 2020/0168611 A1* | 5/2020 | Jeon ..................... H10B 12/482 |

FOREIGN PATENT DOCUMENTS

| | | | |
|---|---|---|---|
| CN | 108899309 | * 11/2017 | ........... H01L 23/522 |
| CN | 110634869 A | 12/2019 | |
| CN | 112447605 A | 3/2021 | |

OTHER PUBLICATIONS

International Search Report in the international application No. PCT/CN2021/090098, dated Jul. 21, 2021, 2 pgs.

* cited by examiner

SEMICONDUCTOR STRUCTURE AND METHOD FOR FORMING SEMICONDUCTOR STRUCTURE

CROSS-REFERENCE TO RELATED APPLICATIONS

This application is a continuation of International Application No. PCT/CN2021/090098, filed on Apr. 27, 2021, which is based upon and claims priority to Chinese Patent Application No. 202010419476.4, filed on May 18, 2020 and entitled "SEMICONDUCTOR STRUCTURE AND METHOD FOR FORMING SEMICONDUCTOR STRUCTURE". The contents of International Application No. PCT/CN2021/090098 and Chinese Patent Application No. 202010419476.4 are incorporated herein by reference in their entireties.

TECHNICAL FIELD

The disclosure relates to the technical field of semiconductors, in particular, to a semiconductor structure and a method for forming the semiconductor structure.

BACKGROUND

Semiconductor devices have been widely used in integrated circuits. For example, dynamic random access memories are a type of semiconductor memories widely used in the integrated circuits. With a continuous decrease of characteristic sizes of semiconductor integrated circuit devices, semiconductor devices are also constantly developing towards a high integration density, and therefore, more severe challenges are presented to the semiconductor forming technology.

With a continuous increase of the integration density of the semiconductor devices, the semiconductor devices may generate leakage current, which will affect storage performance thereof.

Thus, how to effectively reduce the leakage current and improve the storage performance of the semiconductor devices is a technical problem urgent to be solved currently.

SUMMARY

The technical problem to be solved by the disclosure is to provide a semiconductor structure and a method for forming the semiconductor structure.

The present disclosure provides a method for forming a semiconductor structure, the method includes: providing a semiconductor substrate, which has multiple separate active areas that are isolated from each other by shallow trench isolation areas; forming trenches by etching the active areas and the shallow trench isolation areas, herein the trenches include first trenches and second trenches, the first trenches are located in the active areas, the second trenches are located in the shallow trench isolation areas, and the first trenches have a width greater than a width of the second trenches; forming word lines in the trenches, herein the word lines include first word lines and second word lines, each first word line is located in a respective first trench, each second word line is located in a respective second trench, and the first word lines have a width greater than a width of the second word lines.

The present disclosure further provides a semiconductor substrate formed by the above-mentioned method for forming a semiconductor structure. The semiconductor structure includes a semiconductor substrate, which has multiple separate active areas that are isolated from each other by shallow trench isolation areas; and word lines, including first word lines and second word lines. Herein the first word lines are located in the active areas, the second word lines are located in the shallow trench isolation areas, and the first word lines have a width greater than a width of the second word lines.

BRIEF DESCRIPTION OF THE DRAWINGS

In order to describe the technical solutions of the embodiments in the disclosure more clearly, reference will now be made to the accompanying drawings required for the embodiments of the disclosure. It is apparent that the accompanying drawings in the following descriptions are only some embodiments of the disclosure. Other drawings may be obtained by those ordinary skilled in the art according to these accompanying drawings without involving any inventive work.

DETAILED DESCRIPTION

In order to make the objectives, technical manners, and effects of the disclosure clearer, the disclosure will be described further below in conjunction with the accompany drawings. It should to be understood that the embodiments described here are only part of the embodiments of the disclosure, not all of the embodiments, and not intended to limit the disclosure. All other embodiments obtained by those skilled in the art on the basis of the embodiments of the disclosure without involving any inventive work shall fall within the scope of protection of the disclosure.

With a continuous increase of an integration density of a semiconductor device, the semiconductor device may generate leakage current. Through research, the applicant found that a cause of the leakage current is that a parasitic transistor structure is formed in a semiconductor structure. The parasitic transistor structure may generate the leakage current in the semiconductor device.

Through further research, the applicant found that in the semiconductor structure, a buried Word Line (WL) may simultaneously pass through an Active Area (AA) and a Shallow Trench Isolation (STI) area; and when working, the buried word line in the shallow trench isolation area may induce an inversion layer on the active area adjacent the shallow trench isolation area so as to form the parasitic transistor structure, thereby generating the leakage current.

Therefore, the disclosure provides a semiconductor structure and a method for manufacturing the semiconductor structure, which can avoid the formation of the parasitic transistor structure so as to avoid generating the leakage current in the semiconductor structure.

Figure 1:
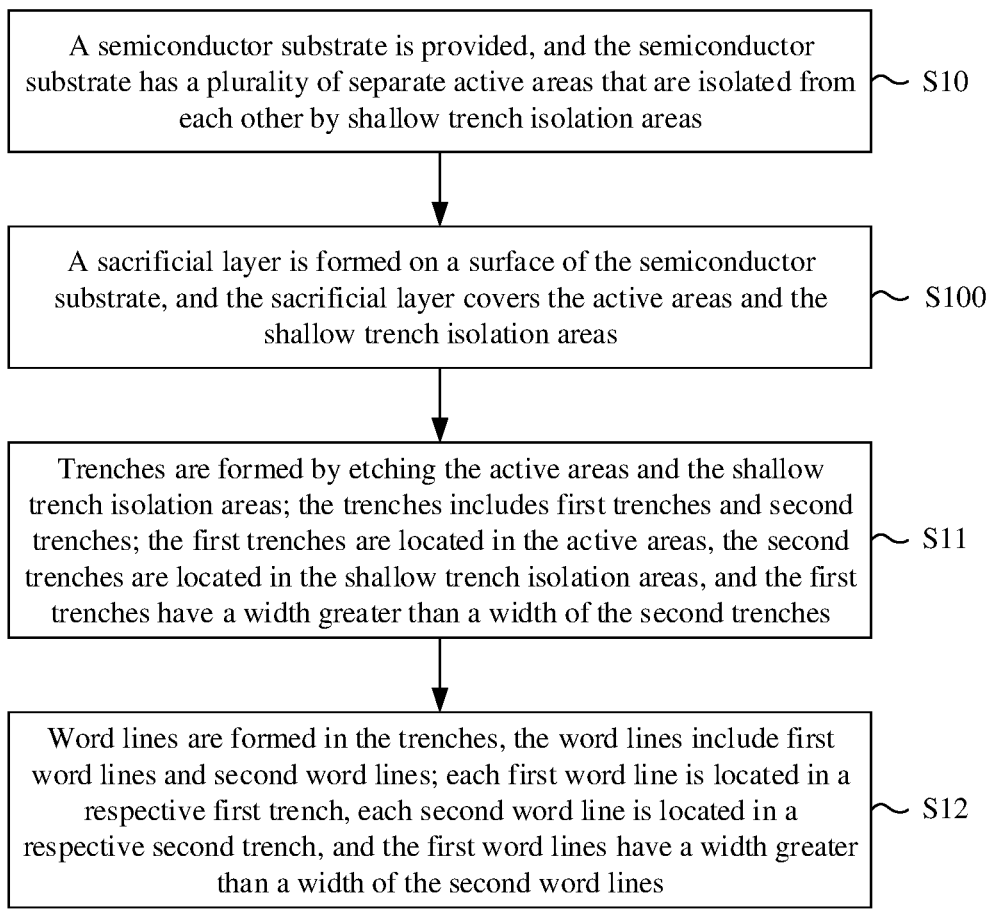
FIG. 1 is a schematic diagram of steps of a method for forming a semiconductor structure according to an embodiment of the disclosure.

FIG. 1 is a schematic diagram of steps of a method for forming a semiconductor structure according to an embodiment of the disclosure. Referring to FIG. 1, the method for forming a semiconductor structure includes steps S10 to S12. At S10, a semiconductor substrate is provided, and the semiconductor substrate has multiple separate active areas that are isolated from each other by shallow trench isolation areas. At S11, the trenches are formed by etching the active areas and the shallow trench isolation areas, herein the trenches include first trenches and second trenches, the first trenches are located in the active areas, the second trenches are located in the shallow trench isolation areas, and the first trenches have a width greater than a width of the second trenches. At S12, the word lines are formed in the trenches, herein the word lines include first word lines and second word lines, each first word line is located in a respective first trench, each second word line is located in a respective second trench, and the first word lines have a width greater than a width of the second word lines.

Figure 2A:
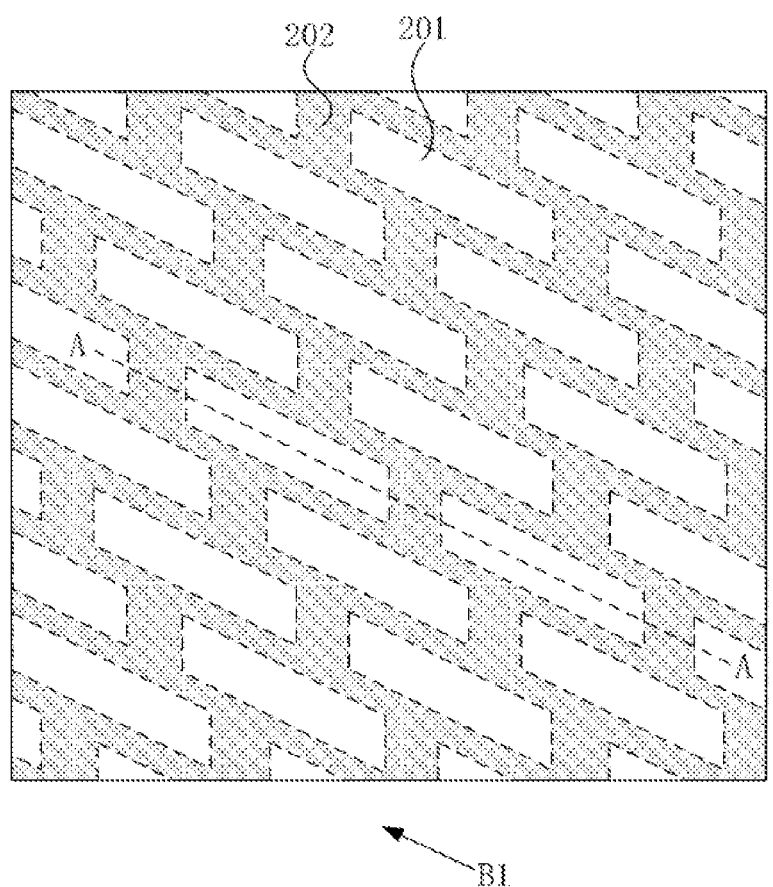
FIG. 2A to FIG. 2N are flowcharts of the process of a method for forming a semiconductor structure according to an embodiment of the disclosure.
Figure 2B:
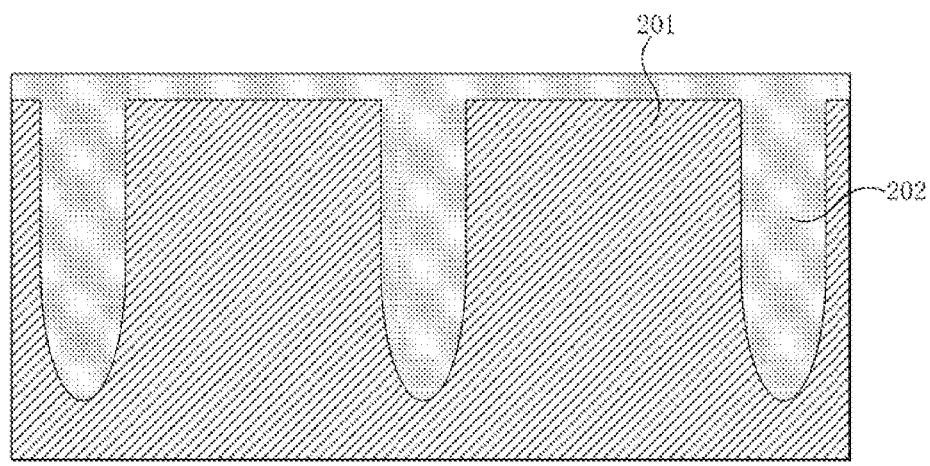
Figure 2C:
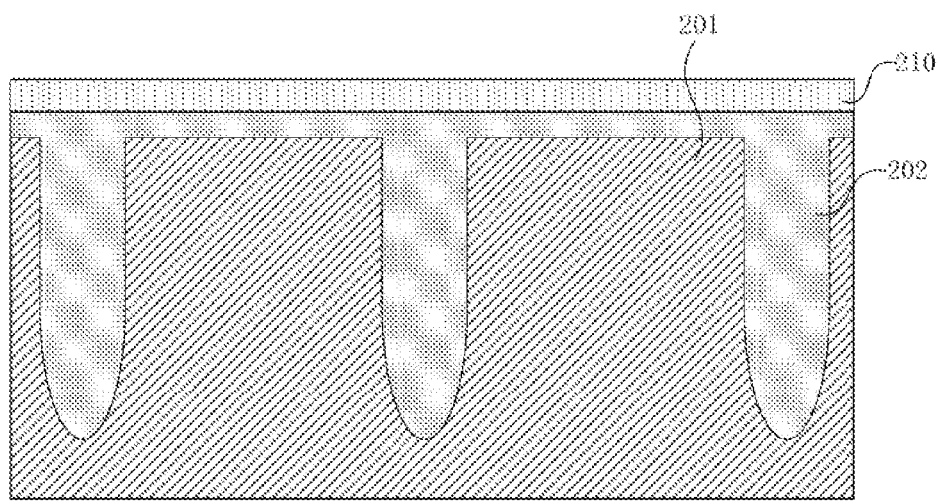
Figure 2D:
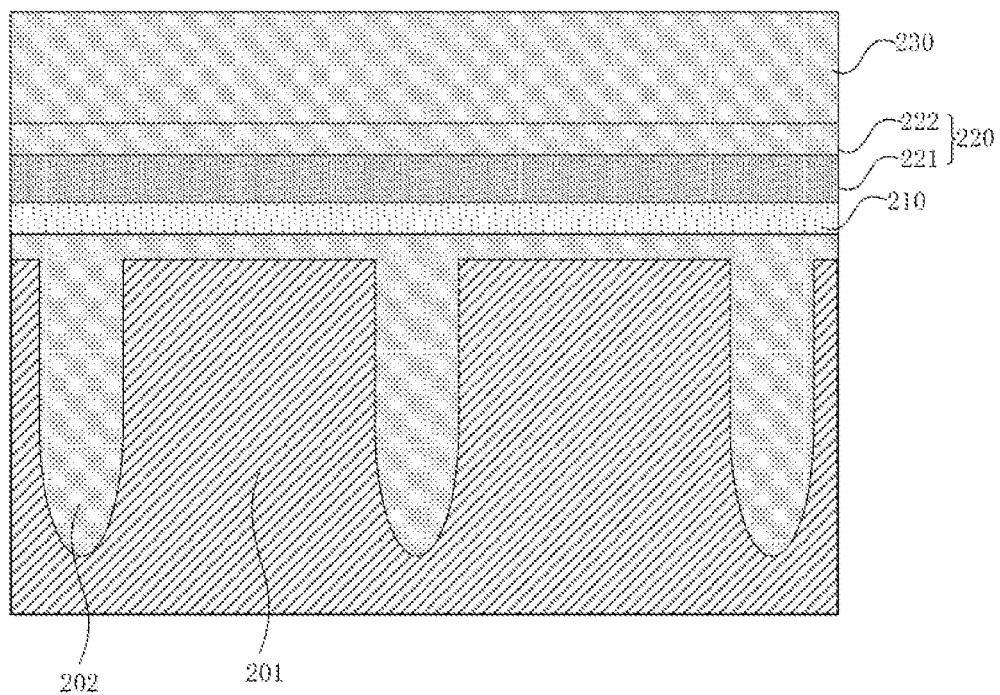
Figure 2E:
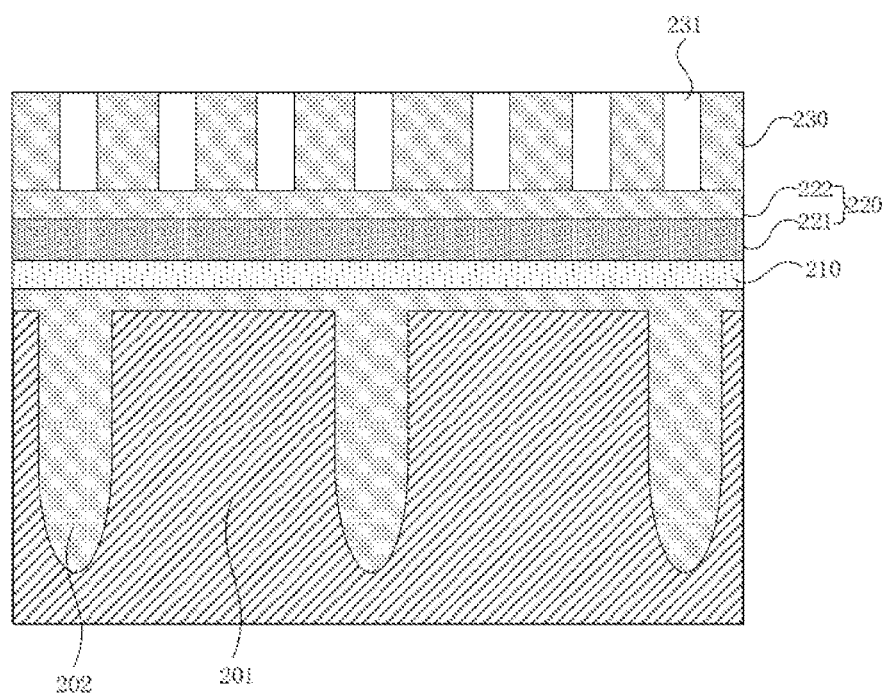
Figure 2F:
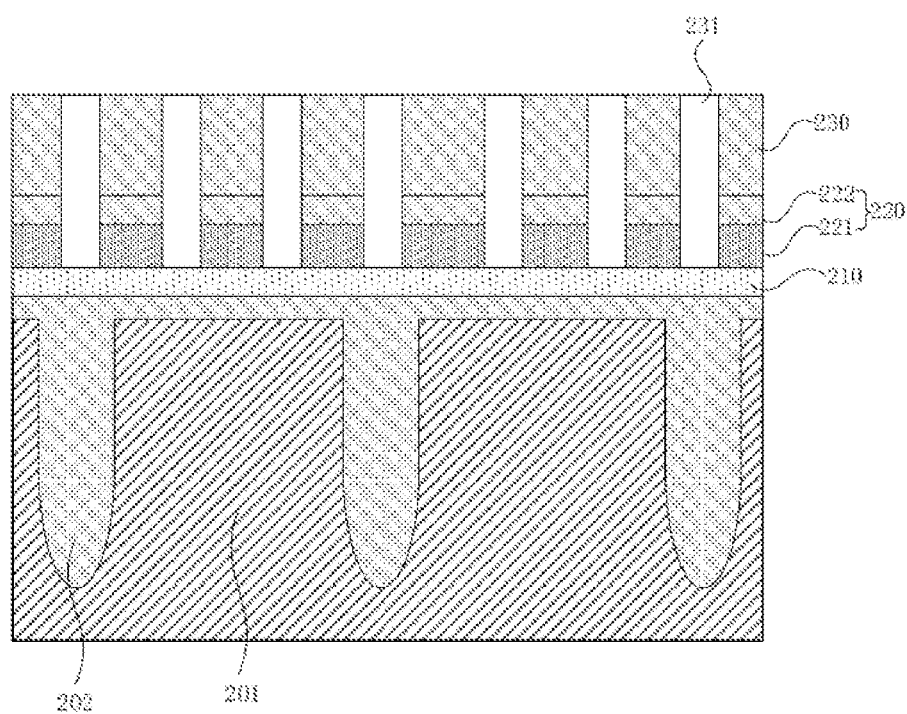
Figure 2G:
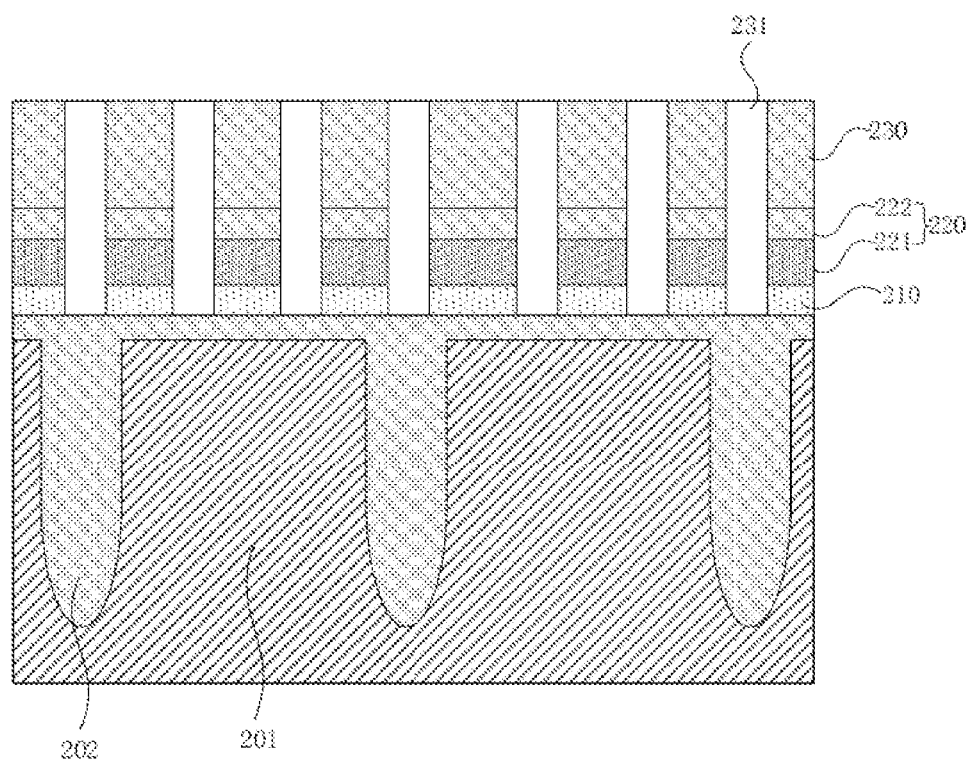
Figure 2H:
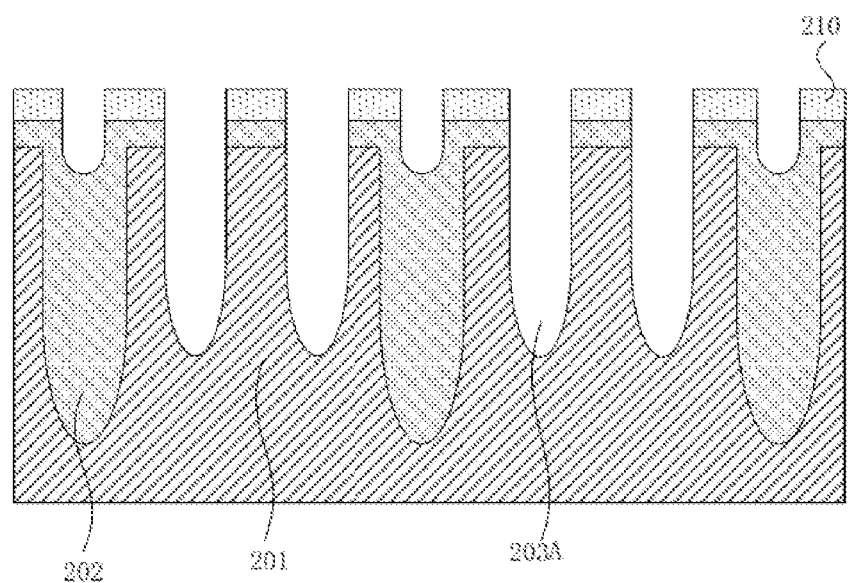
Figure 2I:
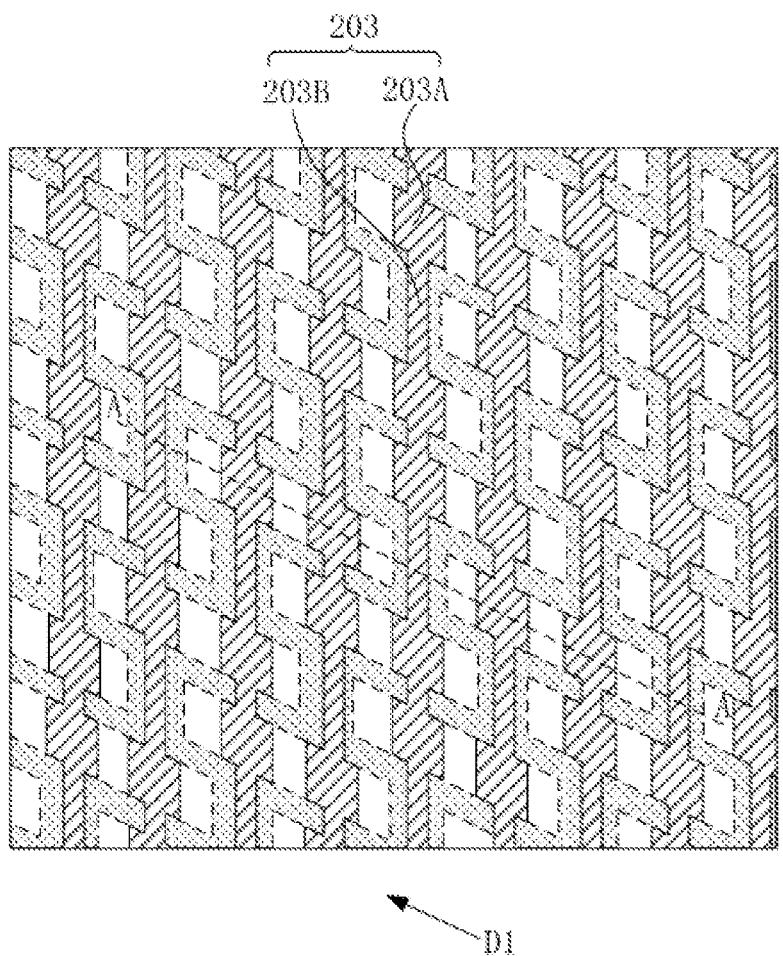
Figure 2J:
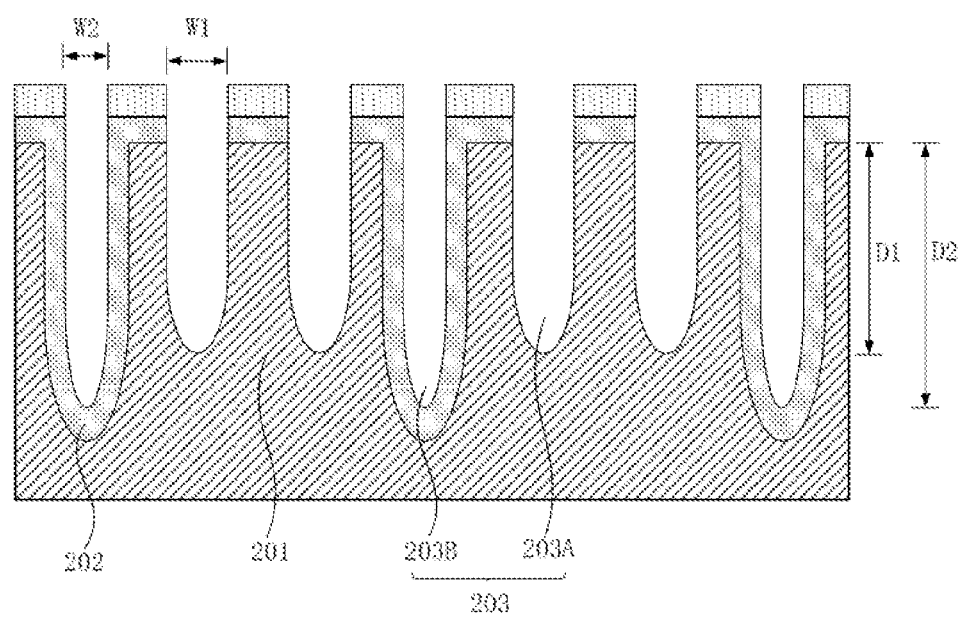
Figure 2K:
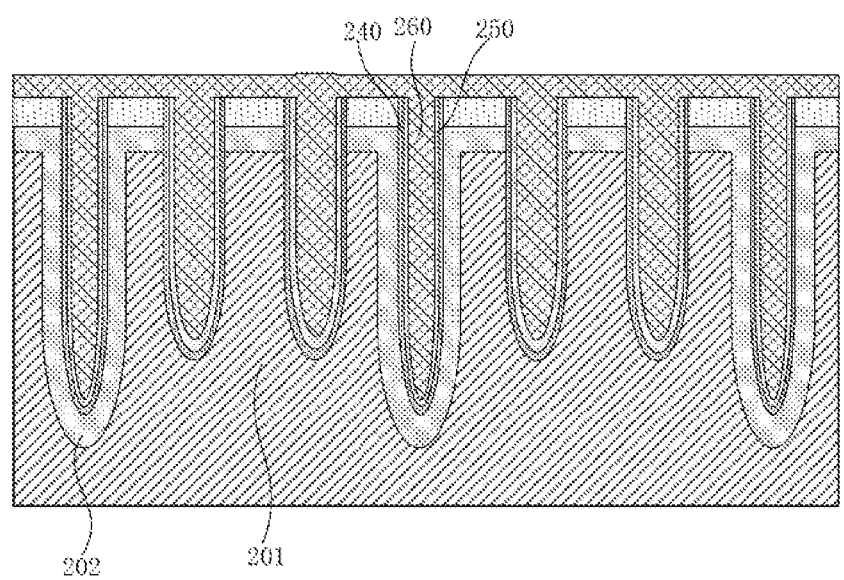
Figure 2L:
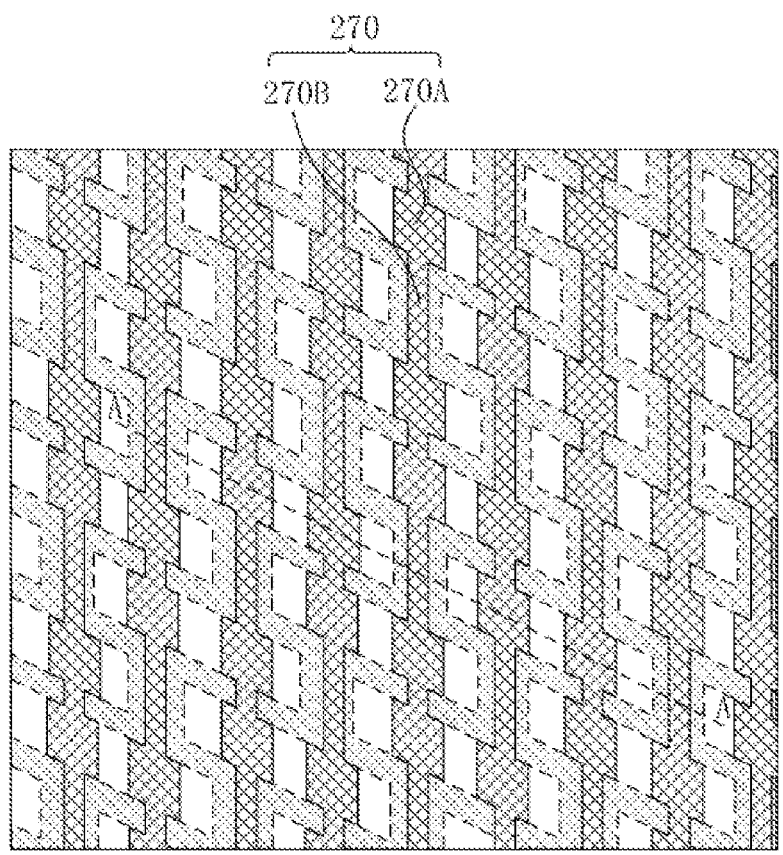
Figure 2M:
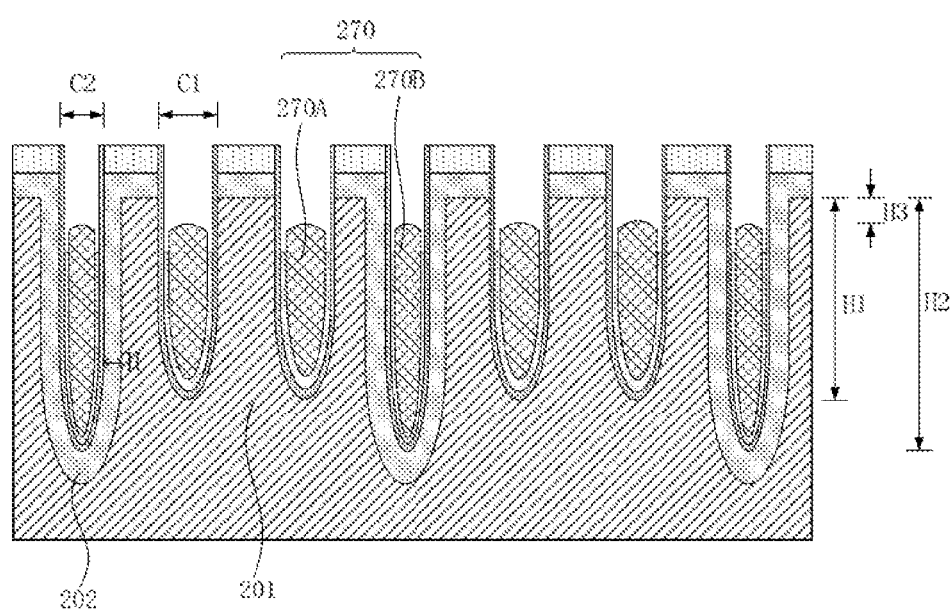
Figure 2N:
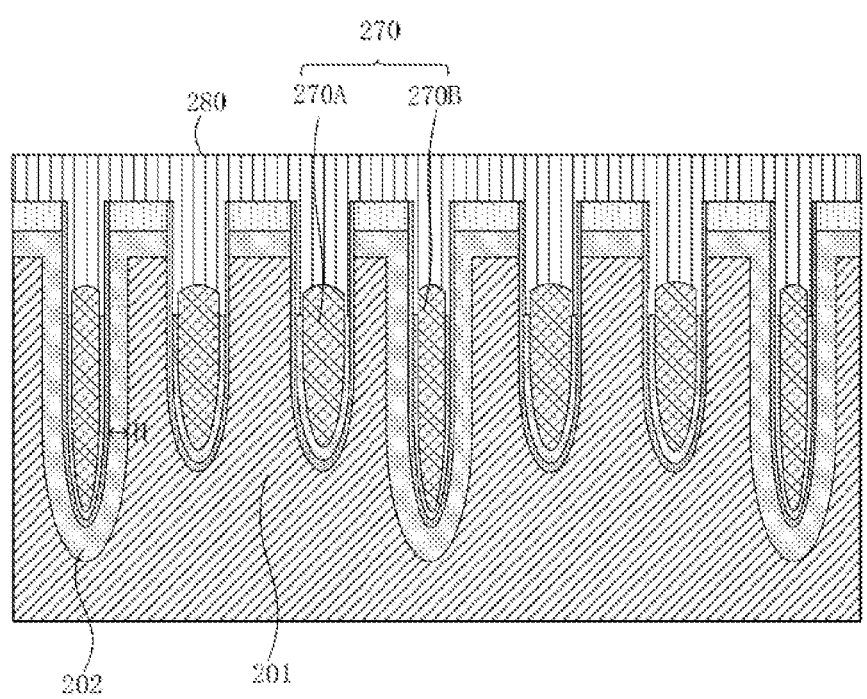

FIG. 2A to FIG. 2N are flowcharts of the process of a method for forming a semiconductor structure according to an embodiment of the disclosure.

Referring to S10, and FIG. 2A and FIG. 2B, herein FIG. 2A is a top view, and FIG. 2B is a cross-sectional diagram along a line A-A in FIG. 2A. A semiconductor substrate is provided. The semiconductor substrate has multiple separate active areas 201 that are isolated from each other by shallow trench isolation areas 202.

The material of the semiconductor substrate may be such as Silicon (Si), Germanium (Ge), Silicon Germanium (GeSi), or Silicon Carbide (SiC), or may be Silicon on Insulator (SOI) or Germanium on Insulator (GOI), or may be other materials, e.g., III-V compounds such as gallium arsenide. In this embodiment, the material of the semiconductor substrate is Silicon. Certain foreign ions are doped in the semiconductor substrate according to requirements. The foreign ions may be N-type foreign ions or P-type foreign ions. In an embodiment, the doping includes well area doping and source/drain area doping.

A method for forming the active areas 201 is provided in the disclosure and the method includes the following steps. Multiple shallow trenches are formed by etching on the semiconductor substrate by means of lithography. The shallow trench isolation areas 202 are formed by filling the shallow trenches with an isolation material. The isolation material includes, but is not limited to, silicon oxide, silicon nitride, silicon oxynitride, or other suitable isolation materials. In the embodiment, the isolation material refers to silicon oxide. Portions, isolated by the shallow trench isolation areas 202, of the semiconductor substrate are the active areas 201. In the embodiment, as illustrated in FIG. 2A, the active areas 201 extend along a direction B 1. The active areas 201 in adjacent rows may be staggered to a certain degree in location.

In the embodiment, when the shallow trenches are filled with the isolation material, the isolation material also covers an upper surface of the semiconductor substrate. That is, upper surfaces of the active areas 201 are also covered with the isolation material. In FIG. 2A, since the active areas 201 are covered by the isolation material, the active areas 201 are drawn with dotted lines. In other embodiments of the disclosure, after the shallow trenches are filled with the isolation material, the isolation material on the upper surface of the semiconductor substrate is removed, and only the isolation material located inside the shallow trenches is remained. Or in the process of filling the shallow trenches with the isolation material, only insides of the shallow trenches are filled with the isolation material, and the upper surface of the semiconductor substrate is not covered with the isolation material.

Optionally, after the step of S10, the following steps are included. Referring to S100 and FIG. 2C, a sacrificial layer 210 is formed on a surface of the semiconductor substrate, and the sacrificial layer 210 covers the active areas 201 and the shallow trench isolation areas 202. The material of the sacrificial layer 210 includes one or more of silicon dioxide, silicon nitride, silicon oxynitride, polysilicon, monocrystalline silicon, and carbon.

Referring to S11, and FIG. 2D to FIG. 2I, the active areas 201 and the shallow trench isolation areas 202 are etched to form the trenches. The trenches 203 include a first trench 203A and a second trench 203B; the first trench 203A is located in the active area 201, and the second trench 203B is located in the shallow trench isolation area 202; and a width of the first trench 203A is greater than a width of the second trench 203B.

In the embodiment, since there is also a sacrificial layer 210 on the surface of the semiconductor substrate, the sacrificial layer 210 may be correspondingly etched to form the trench 203 during performing of the step S11.

In this step, the trenches 203 can be formed using lithography and etching processes. During etching, the widths of the first trench 203A and the second trench 203B are controlled by changing an etch rate of an etching substance on the shallow trench isolation areas 202 and an etch rate of an etching substance on the active areas 201. That is, the widths of the first trench 203A and the second trench 203B are controlled by controlling an etch selection ratio of the etching substance on the shallow trench isolation areas 202 and on the active areas 201. Specifically, the etch rate of the etching substance on the shallow trench isolation areas 202 is less than the etch rate of the etching substance on the active areas 201, so that the width of the first trench 203A is greater than the width of the second trench 203B.

An embodiment of a method for forming the trenches is set forth as below. In the embodiment, the shallow trench isolation areas 202 are silicon dioxide isolation areas, and the active areas 201 are silicon active areas. The method for forming the trench includes the following steps.

Referring to FIG. 2D, a mask layer 220 and a photoresist layer 230 are formed on the sacrificial layer 210. The mask layer 220 may be a single layer or multiple layers. In the embodiment, the mask layer 220 includes a carbon layer 221 and a silicon oxynitride (SION) layer 222 which are arranged in sequence.

Referring to FIG. 2E, the photoresist layer 230 is patterned to form a window 231. Specifically, in this step, the photoresist layer 230 is patterned using an ashing method.

Referring to FIG. 2F, the mask layer 220 is etched along the window 231 to expose the sacrificial layer 210. In this step, HBr and $CF_4$ may be used as etching gases to remove the SION layer 222, and $O_2$, $SO_2$, and Ar may be used as etching gases to remove the carbon layer 221.

Referring to FIG. 2G, the sacrificial layer 210 is continued to be etched to expose the active areas and the shallow trench isolation areas. In this step, $CF_4$, $CH_2F_2$ and He may be used as etching gases to remove the sacrificial layer 210 to expose the active areas and the shallow trench isolation areas.

Referring to FIG. 2H, $Cl_2$, HBr, $CF_4$, and $CHF_3$ are used as gas sources, and the active areas 201 and the shallow trench isolation areas 202 are etched for the first time using a plasma process for a certain period of time. In this step, the etch rate of $Cl_2$, HBr, $CF_4$, and $CHF_3$ on silicon is greater than the etch rate of $Cl_2$, HBr, $CF_4$, and $CHF_3$ on silicon dioxide. Accordingly, the etching parameters, such as an etching time, may be controlled in this step to initially form the first trench 203A with a preset width. It should be understood that in this step, the shallow trench isolation areas may also be etched, with an etching amount much less than that of silicon.

The photoresist layer 230 and the mask layer 220 may be gradually removed by etching during an etching process. If the photoresist layer 230 and the mask layer 220 are not completely removed before the step of forming the first trench 203A as illustrated in FIG. 2H, the remaining photoresist layer 230 and mask layer 220 will be removed using processes such as ashing and etching.

Referring to FIG. 2I and FIG. 2J, FIG. 2I is a top view, and FIG. 2J is a cross-sectional diagram along a line A-A in FIG. 2I. $CF_4$ and $CHF_3$ are used as gas sources, the active areas 201 and the shallow trench isolation areas 202 are etched for the second time using the plasma process for a certain period of time. In this step, an etch rate of $CF_4$ and $CHF_3$ on silicon dioxide is greater than the etch rate of $CF_4$ and $CHF_3$ on silicon. Accordingly, the etching parameters such as an etching time may be controlled in this step to form the second trench 203B with a preset width. It should be understood that, in this step, the active areas 201 may be continued to be etched, with an etching amount much less than that of silicon dioxide.

Further, after etching, a step of cleaning by-products is further included. For example, $O_2$ is used to act on the first trench 203A and the second trench 203B for a certain period of time to clean the by-products.

A width W1 of the first trench 203A formed using the above method is greater than a width W2 of the second trench 203B formed using the above method. It should be understood that those skilled in the art may adopt other methods to form the trenches. Since the width W1 of the first trench 203A is greater than the width W2 of the second trench 203B, widths of a first word line and second lines subsequently formed are also different.

Further, the width W1 of the first trench 203A ranges from 20 nm to 30 nm, and the width W2 of the second trench 203B ranges from 17 nm to 25 nm. A difference between the width W1 of the first trench 203A and the width W2 of the second trench 203B ranges from 4 nm to 10 nm. If a size of the second trench 203B is too small, a width of a second word line 270B (shown in FIG. 2L) subsequently formed in the second trench 203B may be too small, resulting in a large word line resistance and slow switch-on of a transistor.

Further, in the embodiment, a depth D1 of the first trench 203A is less than a depth D2 of the second trench 203B, and thus depths of the first word line and the second word line subsequently formed are also different.

Referring to S12, the word lines are formed in the trenches 203. The word lines include a first word line and a second word line. The first word line is located in the first trench, and the second word line is located in the second trench. The width of the first word line is greater than a width of the second word line.

An embodiment of a method for forming the word lines is set forth as below.

Referring to FIG. 2K, a dielectric layer 240, an adhesion layer 250, and a conductive layer 260 are formed in the trench 203 in sequence. The dielectric layer 240 covers at least an internal surface of the trenches 203, the adhesion layer 250 covers at least the dielectric layer 240, and the conductive layer 260 fills at least the trenches 203. In this embodiment, the dielectric layer 240 and the adhesion layer 250 are only formed in the trenches 203. In other embodiments of the disclosure, under influences of preparation processes, the dielectric layer 240 and the adhesion layer 250 are also formed on the upper surface of the sacrificial layer 210 in sequence. Before forming the conductive layer 260, the dielectric layer 240 and the adhesion layer 250 on the surface of the sacrificial layer 210 are removed. In the embodiment, the conductive layer 260 also covers the upper surface of the sacrificial layer 210.

The dielectric layer 240 may be an oxide layer, which may serve as a gate oxide layer. The dielectric layer 240 may be formed using an In-Situ Steam Generation (ISSG) process. It should be understood that if the dielectric layer 240 is formed by the ISSG process, due to the fact that the material of the shallow trench isolation areas 202 cannot be oxidized, the dielectric layer 240 may be only formed in the first trench 203A of the active area 201, and may not be formed in the second trench 203B of the shallow trench isolation area 202. If the dielectric layer 240 is formed using a deposition method or the like, the dielectric layer 240 may be formed in both the first trench 203A and the second trench 203B.

The adhesion layer 250 may be a titanium nitride layer, and the conductive layer 260 may be a metal tungsten layer.

Referring to FIG. 2L and FIG. 2M, FIG. 2L is a top view, and FIG. 2M is a cross-sectional diagram along a line A-A in FIG. 2M. The word lines 270 are formed by removing part of the adhesion layer 250 and the conductive layer 260. An upper surface of the word lines 270 is lower than the surface of the semiconductor substrate. In the step, the conductive layer 260 is etched to a preset height, and part of the adhesion layer 250 which is not covered by the conductive layer 260 is removed, so that the word lines 270 are formed. A first word line 270A is formed in the first trench 203A, and a second word line 270B is formed in the second trench 203B. Because the dielectric layer 240 and the adhesion layer 250 are thin, in order to avoid line overlapping in the figures, the dielectric layer 240 and the adhesion layer 250 are not illustrated in FIG. 2K. It should be understood that in this step, the dielectric layer 240 may be partially removed or thinned with performing of the etching process.

Further, in a formed word lines structure, an upper surface of the adhesion layer 250 is lower than an upper surface of the conductive layer 260 to reduce a Gate Induce Drain Leakage (GIDL) effect.

Referring to FIG. 2M, since the width W1 of the first trench 203A is greater than the width W2 of the second trench 203B, a width C1 of the first word line 270A is greater than a width C2 of the second word line 270B. Since a thickness H of the shallow trench isolation area 202 between the second word line 270B and the active area 201 adjacent thereto is large enough, when the second word line 270B is powered to work, an inversion layer, on the active area 201, induced by the second word line 270B has a small or no thickness, which is not enough to form a parasitic transistor structure, so that the leakage current will not be generated, and the storage performance of the semiconductor device is greatly improved. In certain technical solutions, the first word line and the second word line have the same width. When the second word line is powered to work, an inversion layer, on the active area adjacent thereto, induced by the second word line has a large thickness, so that a parasitic transistor structure can be formed, and the leakage current may be generated.

Further, since a depth D1 of the first trench 203A is less than a depth D2 of the second trench 203B, a distance H1 from the bottom of the first word line 270A to the surface of the semiconductor substrate is less than a distance H2 from the bottom of the second word line 270B to the surface of the semiconductor substrate, so that a fin-shaped structure is formed to increase a channel width and improve performance of the transistor of the semiconductor device formed subsequently. Further, the distance H1 from the bottom of the first word line 270A to the surface of the semiconductor substrate ranges from 140 nm to 165 nm, and the distance H2 from the bottom of the second word line 270B to the surface of the semiconductor substrate ranges from 175 nm to 190 nm.

Further, the upper surfaces of the first word line 270A and the second word line 270B are flush, and a distance H3 from the upper surfaces of the first word line 270A and the second word line 270B to the surface of the semiconductor substrate ranges from 60 nm to 75 nm. Further, after the step of S12, the method further includes the following step: referring to FIG. 2N, a protective layer 280 is filled. The protective layer 280 covers at least the word lines 270 to avoid the conductive layer 260 being oxidized. The protective layer 280 may be a SiN layer. In this embodiment, the protective layer 280 also covers the surface of the sacrificial layer 210.

Figure 3A:
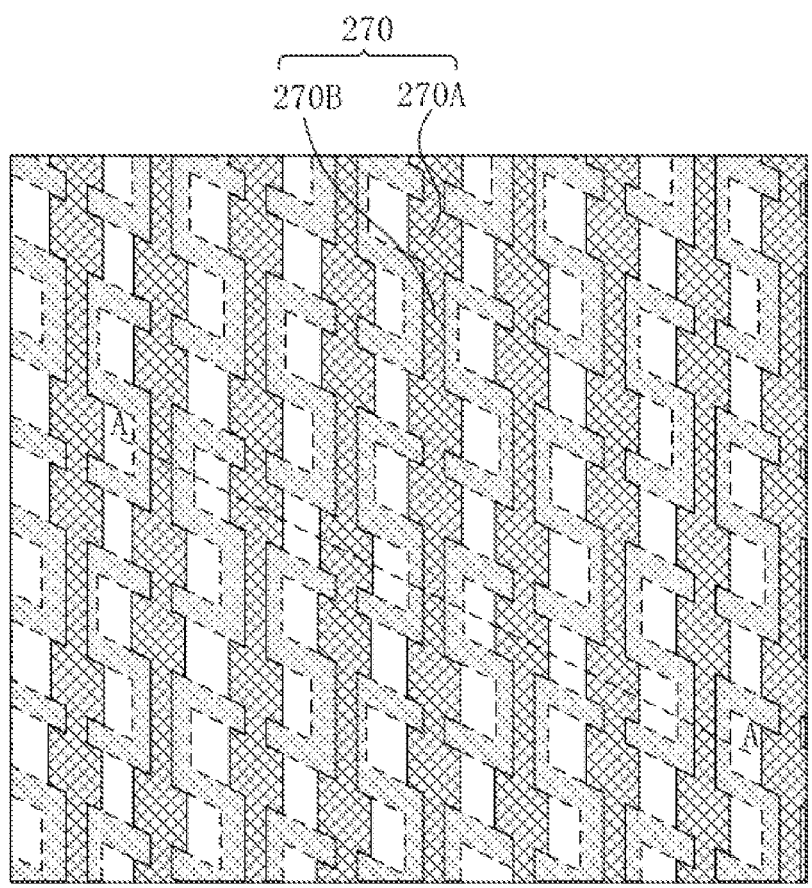
FIG. 3A and FIG. 3B are structural schematic diagrams of a semiconductor structure according to an embodiment of the disclosure.
Figure 3B:
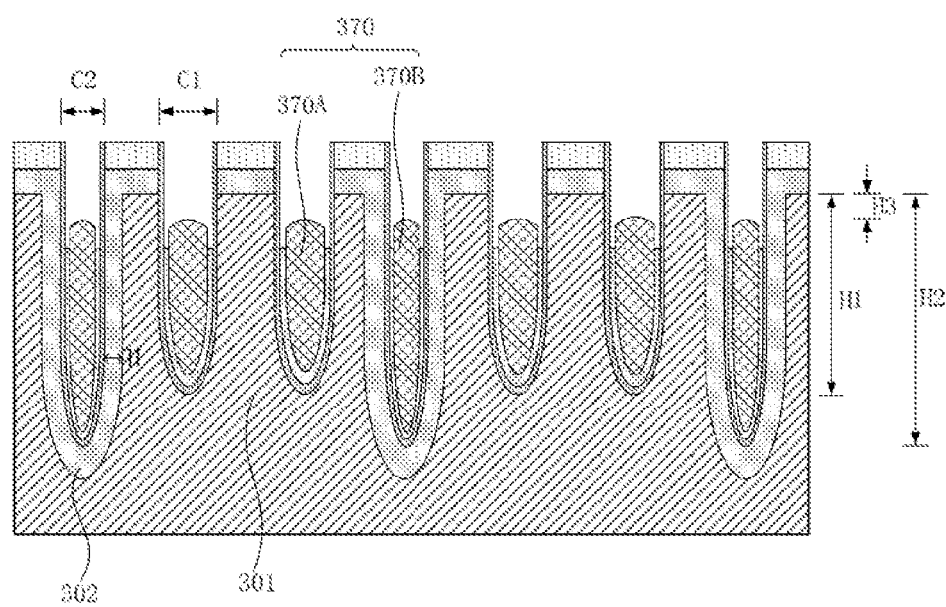

The disclosure further provides a semiconductor structure formed by using the above fabrication methods. FIG. 3A and FIG. 3B are structural schematic diagrams of a semiconductor structure according to an embodiment of the disclosure. FIG. 3A is a top view, and FIG. 3B is a cross-sectional diagram along a line A-A in FIG. 3A. Referring to FIG. 3A and FIG. 3B, the semiconductor structure includes a semiconductor substrate and word lines 370.

The semiconductor substrate has multiple separate active areas 301 that are isolated from each other by shallow trench isolation areas 302.

The word lines 370 include a first word line 370A and a second word line 370B. The first word line 370A is located in the active area 301, and the second word line 370B is located in the shallow trench isolation area 302. A width C1 of the first word line 370A is greater than a width C2 of the second word line 370B. Further, the width C1 of the first word line 370A ranges from 20 nm to 30 nm, and the width C2 of the second word line 370B ranges from 17 nm to 25 nm. A difference between the width of the first word line 370A and the width of the second word line 370B ranges from 4 nm to 10 nm. Herein, if the width of the second word line 370B is too small, word line resistance may be large and switch-on of a transistor may be slow.

Further, a distance H1 from the bottom of the first word line 370A to the surface of the semiconductor substrate is less than a distance H2 from the bottom of the second word line 370B to the surface of the semiconductor substrate, so that a fin-shaped structure is formed to increase a channel width and improve performance of the transistor of the semiconductor device formed subsequently. Further, the distance H1 from the bottom of the first word line 370A to the surface of the semiconductor substrate ranges from 140 nm to 165 nm, and the distance H2 from the bottom of the second word line 370B to the surface of the semiconductor substrate ranges from 175 nm to 190 nm.

Further, upper surfaces of the first word line 370A and the second word line 370B are flush, and a distance H3 from the upper surfaces of the first word line 370A and the second word line 370B to the surface of the semiconductor substrate ranges from 60 nm to 75 nm.

Figure 4:
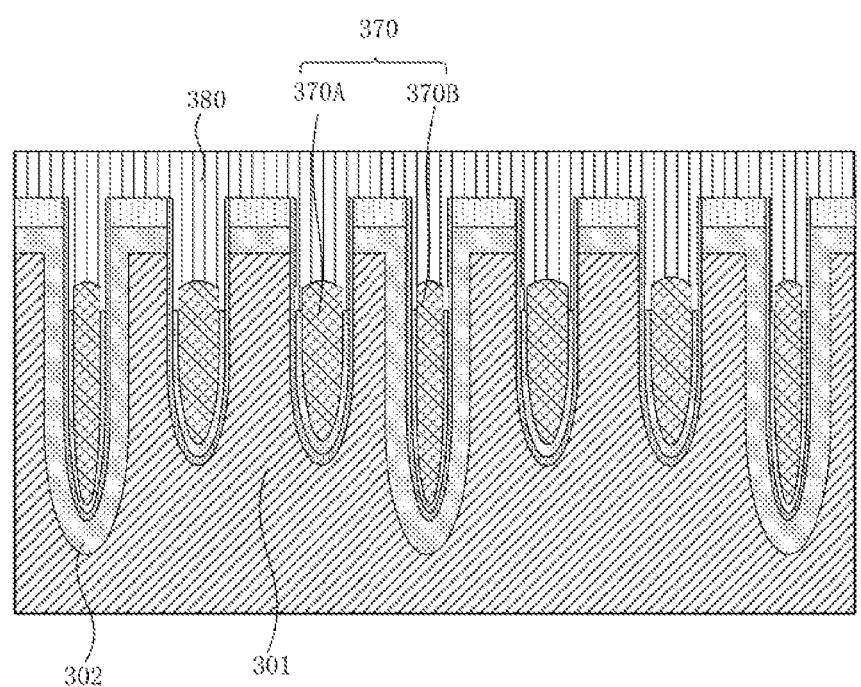
FIG. 4 is a structural schematic diagram of a semiconductor structure according to another embodiment of the disclosure.

FIG. 4 is a structural schematic diagram of a semiconductor structure according to another embodiment of the disclosure.

In the disclosure, a thickness H of each shallow trench isolation area 302 between the respective second word line 370B and the respective active area 301 adjacent thereto is large enough, when the second word line 370B is powered to work, an inversion layer, on the active area 301, induced by the second word line 370B has a small or no thickness, which is not enough to form a parasitic transistor structure, so that leakage current will not be generated, and storage performance of the semiconductor device is greatly improved.

The above are only preferred implementations of the disclosure. It should be understood that those ordinary skilled in the art may also make several improvements and modifications without departing from the principle of the disclosure. These improvements and modifications shall fall within the scope of protection of the disclosure.

The invention claimed is:

1. A method for forming a semiconductor structure, comprising:

providing a semiconductor substrate, the semiconductor substrate having a plurality of separate active areas that are isolated from each other by shallow trench isolation areas;

forming trenches by etching the active areas and the shallow trench isolation areas, wherein the trenches comprise first trenches and second trenches, the first trenches are located in the active areas, the second trenches are located in the shallow trench isolation areas, and the first trenches have a width greater than a width of the second trenches; and forming word lines in the trenches, wherein the word lines comprise first word lines and second word lines, each of the first word lines is located in a respective first trench of the first trenches, each of the second word lines is located in a respective second trench of the second trenches, and the first word lines have a width greater than a width of the second word lines, wherein in the step of forming the trenches by etching the active areas and the shallow trench isolation areas, an etch rate of an etching substance on the shallow trench isolation areas is less than an etch rate of the etching substance on the active areas, so that the first trenches have the width greater than the width of the second trenches, wherein the shallow trench isolation areas are silicon dioxide isolation areas, the active areas are silicon active areas, and forming the trenches by etching the active areas and the shallow trench isolation areas comprises:

forming a mask layer and a photoresist layer on the semiconductor substrate;

forming a window by patterning the photoresist layer;

exposing the silicon active areas and the silicon dioxide isolation areas by etching the mask layer along the window;

using $Cl_2$, HBr, $CF_4$, and $CHF_3$ as gas sources, and etching, for a first time, the silicon active areas and the silicon dioxide isolation areas using a plasma process for a period of time; and using the $CF_4$ and the $CHF_3$ as gas sources, and etching, for a second time, the silicon active areas and the silicon dioxide isolation areas using the plasma process for a second period of time to form the first trenches and the second trenches.

2. The method for forming a semiconductor structure of claim 1, wherein the first trenches have a depth less than a depth of the second trenches, and a distance from a bottom of the first word lines to a surface of the semiconductor substrate is less than a distance from a bottom of the second trenches to the surface of the semiconductor substrate.

3. The method for forming a semiconductor structure of claim 1, wherein before forming the trenches by etching the active areas and the shallow trench isolation areas, the method further comprises: forming a sacrificial layer on a surface of the semiconductor substrate, wherein the sacrificial layer covers the active areas and the shallow trench isolation areas; and forming the trenches by etching the active areas and the shallow trench isolation areas comprises: forming the trenches by etching the sacrificial layer, the active areas, and the shallow trench isolation areas.

4. The method for forming a semiconductor structure of claim 1, wherein forming the word lines in the trenches further comprises:
   forming a dielectric layer, an adhesion layer, and a conductive layer in the trenches in sequence, wherein the dielectric layer covers at least an internal surface of the trenches, the adhesion layer covers at least the dielectric layer, and the conductive layer fills at least the trenches; and
   forming the word lines by removing part of the adhesion layer and the conductive layer, wherein the word lines have an upper surface lower than a surface of the semiconductor substrate.

5. The method for forming a semiconductor structure of claim 4, wherein after forming the word lines in the trenches, a protective layer is filled, the protective layer covering at least the word lines.

6. A semiconductor structure, formed by the method for forming the semiconductor structure of claim 1, wherein the semiconductor structure comprises:
   the semiconductor substrate, having the plurality of separate active areas that are isolated from each other by the shallow trench isolation areas; and
   the word lines located in the trenches comprising the first trenches and the second trenches, wherein the word lines comprise the first word lines and the second word lines, the first word lines are located in the first trenches in the active areas, the second word lines are located in the second trenches in the shallow trench isolation areas, and the first word lines have the width greater than the width of the second word lines,
wherein the first trenches have the width greater than the width of the second trenches.

7. The semiconductor structure of claim 6, wherein a difference between the width of the first word lines and the width of the second word lines ranges from 4_nm to 10_nm.

8. The semiconductor structure of claim 6, wherein the width of the first word lines ranges from 20_nm to 30 nm, and the width of the second word lines ranges from 17_nm to 25_nm.

9. The semiconductor structure of claim 6, wherein a distance from a bottom of the first word lines to a surface of the semiconductor substrate is less than a distance from a bottom of the second word lines to the surface of the semiconductor substrate.

10. The semiconductor structure of claim 9, wherein the distance from the bottom of the first word lines to the surface of the semiconductor substrate ranges from 140_nm to 165_nm, and the distance from the bottom of the second word lines to the surface of the semiconductor substrate ranges from 175_nm to 190_nm.

11. The semiconductor structure of claim 9, wherein an upper surface of the word lines is lower than the surface of the semiconductor substrate.

12. The semiconductor structure of claim 11, wherein a distance from the upper surface of the word lines to the surface of the semiconductor substrate ranges from 60_nm to 75_nm.

13. The semiconductor structure of claim 6, wherein each of the word lines comprises a dielectric layer, an adhesion layer, and a conductive layer which are arranged in sequence.

14. The semiconductor structure of claim 13, wherein the adhesion layer has an upper surface lower than an upper surface of the conductive layer.

15. The semiconductor structure of claim 6, wherein the semiconductor structure further comprises a protective layer which covers at least the word lines.

16. The semiconductor structure of claim 6, wherein a depth of the first word lines ranges from 65_nm to 105 nm, a depth of the second word lines ranges from 100_nm to 130_nm, the width of the first word lines ranges from 20_nm to 30 nm, and the width of the second word lines ranges from 17_nm to 25_nm.

* * * * *